United States Patent [19]

Dessaux et al.

[11] Patent Number: 5,236,747
[45] Date of Patent: Aug. 17, 1993

[54] PROCESS FOR METALLIZING A SURFACE

[75] Inventors: Odile Dessaux; Pierre W. N. Goudmand; Abdellah Ben Taleb, all of Lille; Catherine Cannesson, Villeneuve d'ASCQ, all of France

[73] Assignee: Plasmametal, France

[21] Appl. No.: 724,181

[22] Filed: Jul. 1, 1991

[30] Foreign Application Priority Data

Jul. 6, 1990 [FR] France .................. 90 08602

[51] Int. Cl.$^5$ .................. B05D 3/06
[52] U.S. Cl. .................. 427/535; 427/562; 427/564; 427/576
[58] Field of Search .................. 427/38, 39, 40, 45.1, 427/535, 537, 562, 564, 576

[56] References Cited

U.S. PATENT DOCUMENTS

| 4,072,769 | 2/1978 | Lidel | 427/38 |
|---|---|---|---|
| 4,250,225 | 2/1981 | Shirahata et al. | 427/40 |
| 4,250,832 | 2/1981 | Ozaki | 427/38 |
| 4,324,854 | 4/1982 | Beauchamp et al. | 427/38 |
| 4,335,160 | 6/1982 | Neary et al. | 427/38 |
| 4,385,645 | 5/1983 | Campbell et al. | 427/39 |
| 4,509,451 | 4/1985 | Collins et al. | 427/39 |
| 4,618,542 | 10/1986 | Morita et al. | 427/39 |
| 4,626,448 | 12/1986 | Hays | 427/39 |
| 4,876,112 | 10/1989 | Kaito et al. | 427/38 |
| 4,908,226 | 3/1990 | Kubena et al. | 427/38 |
| 4,942,057 | 7/1990 | Steinwandel et al. | 427/38 |
| 5,083,033 | 1/1992 | Komano et al. | 427/38 |
| 5,147,678 | 9/1992 | Foerch et al. | 427/562 |
| 5,180,435 | 1/1993 | Markunas et al. | 427/562 |

FOREIGN PATENT DOCUMENTS

| 0305241 | 3/1989 | European Pat. Off. . |
| 0345107 | 12/1989 | European Pat. Off. . |
| 2616088 | 12/1988 | France . |

Primary Examiner—Marianne Padgett
Attorney, Agent, or Firm—Parkhurst, Wendel & Rossi

[57] ABSTRACT

A workpiece having a surface to be metallised is placed in an enclosure. A plasma is produced in a plasma tube which extends into the enclosure, the plasma having a post-discharge zone in which the surface to be metallised is placed. Vapour of a metal carbonyl compound is injected into the enclosure, such compound dissociating in the post-discharge plasma to cause the metal to be deposited on the surface.

11 Claims, 1 Drawing Sheet

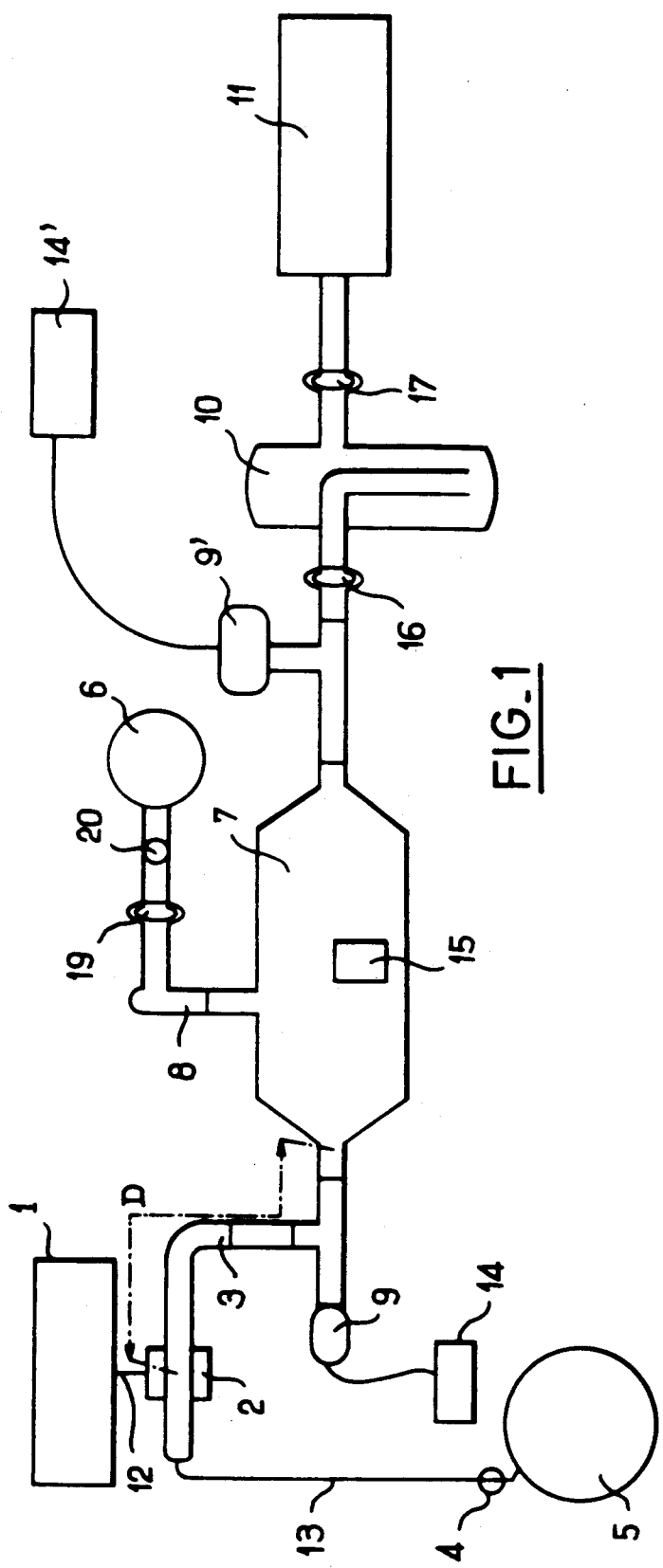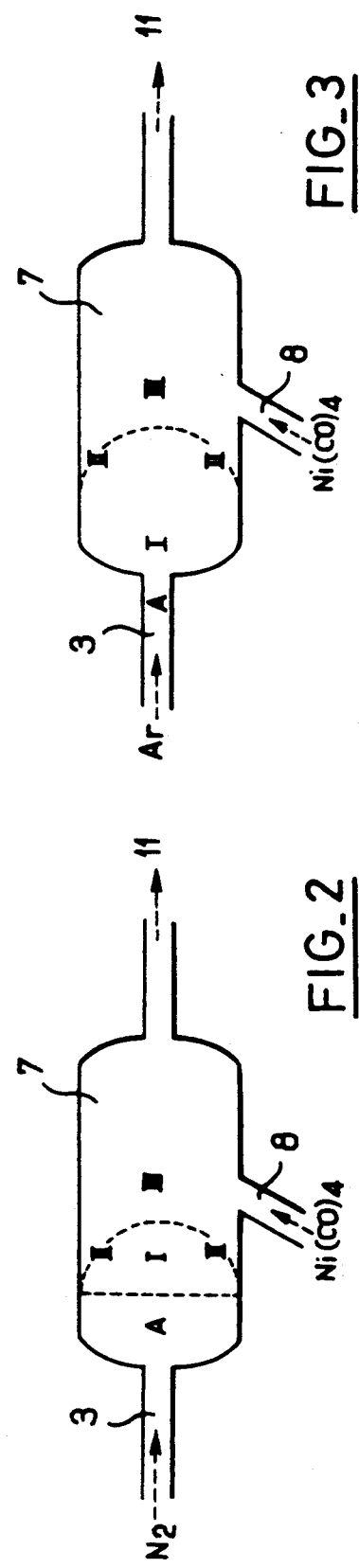

PROCESS FOR METALLIZING A SURFACE

BACKGROUND OF THE INVENTION

This invention relates to a process for metallising a surface.

The process according to the invention enables many materials such as plastics, glass, ceramics, metals including alloys, composite materials and fibers to be metallised. The process is also of use for producing thin-layer deposits for catalysts, for example, on alumina.

RELATED ART

Many materials cannot be metallised by known electrochemical processes. Further known electrochemical processes cause pollution problems.

Vacuum evaporation methods such as cathode sputter have also been developed wherein a metal target is bombarded electronically so that metal particles of the target are detached and are deposited on the surface of the workpiece. It is difficult with these methods to control the thickness of the deposited metal, and such methods are not suitable for depositing layers of metal alloys.

A metallising process using gas compounds of a metal carbonyl, $M-(CO)u$, is known wherein the gas medium is irradiated by a laser beam near the surface to be metallised. A photochemical reaction which, in the case of using a laser, occurs in the visible or ultraviolet range of radiation, or a thermolysis, in the case of using an infrared laser, dissociates the metal carbonyl molecules, such dissociation releasing metal atoms which are deposited on the workpiece surface.

It is very costly to carry this irradiation process into practice, and is of use only for metallising very small areas with high beam energies. Also, the resulting heating is incompatible with the heat characteristics of some workpieces.

The applicants have studied the application of plasma technology to the metallisation of surfaces with the use of metal carbonyl compounds as a new approach to the problem of metallisation. Metallisation by an injection of metal carbonyl gas in the discharge zone of a plasma has been tested but leads to deposits having a high carbon content since the high energy imparted to the carbonyl metal gas dissociates the carbonyl radicals, CO, thus suppling carbon atoms in addition to the metal atoms. Also, this method would be limited to small workpieces since the discharge zone of a plasma is as a rule restricted.

SUMMARY OF THE INVENTION

It is the object of this invention to devise an economical and large scale process for surface metallisation of a new kind such that metals can be deposited on a very wide range of materials, including some plastics which are usually difficult to metallise.

According to the invention, a workpiece having a surface is placed in an enclosure, a plasma is produced in a plasma tube which extends into the enclosure, the plasma having a post-discharge zone in which the surface to be metallised is placed, and the vapour of a carbonyl metal compound is injected into the enclosure.

The post-discharge zone of the plasma is a zone disposed, in relation to the direction of flow of the plasmagenic gas, downstream of the coupler where a discharge excites the gas particles.

In such zone the charged ions and electrons have mostly disappeared from the plasma, thereby leaving a substantial concentration of free radical-like atoms and energy-excited atoms or molecules which make up what is normally called "post discharge plasma" or "delayed plasma". The post-discharge plasma has the property of being a cold plasma in that the particles of which it consists have a low translation temperature (typically the ambient temperature) and high temperatures of dissociation To, vibration Tv and electronic excitation Telec (typically, a few thousand Kelvin). The reactive environment is therefore in a state of thermodynamic non-equilibrium. It is produced in dynamic conditions by the extraction of excited species of a conventional cold discharge plasma after expansion in an enclosure disposed outside the electric field producing the discharge plasma.

An example of an installation for producing a post-discharge plasma was disclosed in French patent application FR-A-2 616 088.

The metal carbonyl gas injection into the post-discharge plasma produces dissociation of the $M-(CO)n$ molecules forming the gas, leading to the production of metal atoms M which are deposited on the surface of the workpiece to be metallised.

The process is simple and economical, and facilitates the treatment of large surfaces in that the plasma post-discharge zone can be of a substantial capacity appreciably greater than the capacity of the discharge zone. Metallisation can therefore proceed in a capacity of up to several hundred liters. Also, the thickness of the deposit can be controlled satisfactorily. The process is compatible with a very large number of materials (plastics, glass, ceramics, other metals, composites and so on), since the only requirement of the workpiece it is able to that withstand the cold non-ionized post-discharge plasma which is outside an electromagnetic field. This kind of plasma has very little effect on most materials.

Preferably, the surface to be metallised is pretreated in the enclosure by a nitrogen post-discharge plasma without an addition of metal carbonyl compound.

This pretreatment, as described in document FR-A-2 616 088, enhances the adhesion of the metal deposit to the substrate to be metallised. Carrying out the treatment in situ in the same enclosure as is used for the metallisation step has advantages of reducing the number of workpiece handlings and of convenience of carrying out all the steps within the same installation.

Other features and advantages of this invention will become apparent from the following detailed description of embodiments of the process. In the accompanying exemplary and non-limitative drawings:

FIG. 1 is a diagrammatic view of an installation for the practice of the process according to the invention, and FIGS. 2 and 3 show the working conditions in the enclosure in two exemplary uses of the process.

The installation shown in FIG. 1 for the practice of the process according to the invention has similarities with the installation described in document FR-A-2 616 088.

A workpiece 15 to be metallised is placed in an enclosure 7. A quartz or pyrex plasma tube 3 extends into the enclosure 7. The excitation zone for the plasmagenic gas is disposed towards the other end of the tube 3. A coupler 2 is placed around the tube 3 and is connected to a microwave generator 1 by microwave transmission means 12.

By way of example, the microwave generator 1 can have a rated frequency of 2450 MHz and an output power which can be adjusted between 0 and 1500 W.

The coupler 2 can be a rectangular cavity, as described in detail in the article "Cavité Micro-onde pour plasma á pression atmospherique" by G. Moreau, O. Dessaux and P. Goudmand which appeared in J. Phys. E. Sc. Inst. 16, 1983, pages 1160–1161. The microwaves are transmitted from the generator over a wave guide, constituting transmission means. Another possibility for the coupler 2 is to use a cylindrical cavity described in detail in an article by C. Dupret, B. Vidal and P. Goudmand which appeared in Rev. Phys. Appl. 5, 337 (1970), the microwave being transmitted from a generator over a coaxial cable constituting transmission means.

A discharge induced by the electrical energy of the microwaves is produced in the plasma tube 3. The plasma produced near the coupler 2 is a cold discharge plasma containing electrons and ionized species.

The plasmagenic gas, which can be nitrogen or argon, is taken from a source 5 and enters the plasma tube 3 by way of a line 13. A micrometer needle valve 4 is disposed on the line 13 to control the plasmagenic gas delivery.

The plasmagenic gas flows towards the enclosure 7 containing the surface to be metallised, the enclosure 7 being effective as the expansion chamber for producing the post-discharge plasma by expansion from the discharge plasma present in the tube 3.

In early experiments, the chamber 7 was connected to the tube 3 by two flat connectors with a Teflon packing. The distance D between the discharge and the reaction chamber is variable (values of $D_{N2}$ of 130 cm for a nitrogen plasma and $D_{AR}$ of 40 cm for an argon plasma were used). The workpieces or specimens consisting, for example, of ABS (acrylonitrile butadiene styrene) are placed in the reactor on polypropylene supports. The enclosure 7 is also connected by a spherical connector 16 to a liquid nitrogen trap 10 which protects a vacuum pump 11 disposed downstream of the trap 10 and connected thereto by a second spherical connector 17. Typically, the pump 11 has a delivery of 25 m$^3$/h at atmospheric pressure.

Pressure gauges 9, 9' are disposed along the path of the plasmagenic gas upstream and downstream respectively of the enclosure 7. The pressures measured by the gauges 9, 9' are transmitted to display devices 14, 14' indicating the treatment conditions to the operator. The pressure in the enclosure 7 can be checked on the gauges 9, 9' and can be adjusted by using the valve 4 to limit the gas delivery or altering the pumping conditions of the pump 11.

An injection line 8 for metal carbonyl gas is disposed on the side of the enclosure 7 and is connected to the supply source 6 by a flat connector having a PTFE packing, a spherical glass connector 19 and a micrometer valve 20 for controlling gas delivery. Carbonyl gas delivery is adjusted in the basis of visual observations of the colouring of the reactive medium present in the enclosure 7. The metal carbonyl gas is injected at a low pressure which is typically less than one-third of the plasmagenic gas pressure.

Enclosures 7 having capacities of 0.7 l and 9 l were used in tests. These capacities are considerably greater than the capacity of the plasma tube 3 so that the plasmagenic gas can expand to form the post-discharge plasma. For industrial use the capacity of the enclosure 7 can of course readily be increased to several hundreds of liters and thus enable fairly bulky workpieces to be treated.

A description will now be given of experiments for nickel-plating plastics workpieces, the experiments having been carried out with the installation hereinbefore described.

Two kinds of plasmagenic gas were used, $N_2$ and Ar. More generally, the use of a rare gas, a mixture of $N_2$ and Ar, or $N_2$ and a rare gas can be considered. The reactions Ni $(CO)_4 + N_2$, and Ni $(CO)_4 + Ar$ proceed at the ordinary ambient temperature.

Two consecutive operations are performed on the substrate to be metallised:

(A) Pretreatment of the substrate by nitrogen plasma to increase adhesion, and (B) Production of the nickel deposit on polypropylene ABS substrates.

A vacuum of approximately $10^{-2}$ millibar is produced in the installation by means of the pumping device 11. Nitrogen is then intaken at a pressure of 5 mbar for 5 minutes to carry out the pretreatment A. A yellow luminescence characteristic of the recombination of nitrogen atoms extends into the reation chamber 7 and downstream thereof as far as the nitrogen trap 10.

This pretreatment by nitrogen plasma without an addition of metal carbonyl gas enhances the wettability of the substrate in order to increase the adhesion of the metal which will subsequently be deposited on the substrate.

If metallisation is carried out with an argon or nitrogen-argon mixture plasma after the pretreatment step, the intake of nitrogen is replaced by an intake of the plasmagenic gas used.

Vapour of the nickel-carbonyl compound Ni $(CO)_4$ is then intaken in trace state into the reaction chamber 7, neither its delivery nor its pressure being measured. Its delivery is adjusted by means of the micrometer valve 20 in line with the visual observations to be described hereinafter.

EXAMPLE 1

In this example, in which a nitrogen plasma is used, the intake of Ni $(CO)_4$ into the enclosure 7 where the post discharge plasma is operative leads to the appearance in the enclosure 7 of four zones (A, I, II, III), which are shown in FIG. 2 and distinguished by the colour of their luminescence.

In zone A, near the entry of the tube 3 into the enclosure 7, a yellow luminescence is observed due to the recombination of the nitrogen atoms. After intake of Ni $(CO)_4$ the yellow luminescence is limited to the zone A.

In zone I downstream of the zone A, a blue luminescence is observed, due to the addition of $Ni(CO)_4$, in the post-discharge nitrogen plasma; however, nickel deposition does not generally occur in zone I.

Zone II, which is the downstream limit of the blue zone I, is the optimal position for producing a substantial nickel deposit.

Zone III, which is downstream of zones A, I, II in the enclosure 7, is colourless. Articles placed in zone III are covered by a nickel deposit.

The nickel deposition conditions correspond to an excess of post-discharge plasma realtive to the carbonyl derivative, which manifests as the presence of a blue luminescence (zone I) which should not appear in the tube 3. The Ni $(CO)_4$ molecules dissociate and the nickel thus formed is deposited on the substrate to form the required metal deposit.

The nitrogen pressure can be varied between 6 and 4 mbar in order to nickel-plate articles disposed throughout the chamber.

The working method is as follows:

Adjusting the pressure ratio $P_{N2}/P_{N1\ (CO)4}$, where $P_{N2}$ denotes the nitrogen pressure in the enclosure 7 and $P_{N1\ (CO)4}$ denotes the nickel carbonyl injection pressure, $P_{N2}$ being 6 mbar so that zone I is disposed at the downstream end of the chamber. The entire upstream portion is occupied by the yellow luminescence (zone A).

A deposit of nickel on the chamber walls is observed in zones II and III with a correlative disappearance of the yellow luminescence in these areas.

Reducing the $P_{N2}/PN1\ (CO)4$ ratio by reducing the nitrogen flow pressure, zone II can be gradually displaced upstream in the chamber. This displacement is accomplished by adjusting $P_{N2}$ to 4 mbar to provide progressive nickel-plating of the articles in the chamber.

To nickel-plate articles distributed in the enclosure 7, the operating schedule just set out involving progressively decreasing the ratio $P_{N2}/P_{1\ (CO)4}$ must be kept, since the Ni deposit on the chamber walls deactivates the plasmagenic gas and hence inhibits progressive nickel plating from an upstream position to a downstream position.

To categorize the nickel deposits formed on the insulating substrates, the ohmic resistance of the deposit yielded by the various treatments is measured (the pretreatment resistances of ABS and polypropylene are $10^{16}$ and $10^{18}$ ohms/cm respectively). The measurements were made after the surface had been cleaned with distilled water and the ohmeter electrodes were placed 1 cm apart from one another on the surface. Table I lists the results.

TABLE I

| POWER TRANSMITTED BY THE GENERATOR 1 (W) | 100 | 300 |
|---|---|---|
| DIAMETER OF THE TUBE 3 (mm) | 15 | 30 |
| VOLUME OF THE ENCLOSURE 7 (l) | 0.7 | 9 |
| NITROGEN PRESSURE (mbar) | 5 | 5 |
| TREATMENT TIME (mn) | 30 | 60 |
| ABS SUBSTRATE | 6 Ω/cm | 23 Ω/cm |
| POLYPROPYLENE SUBSTRATE | 91 Ω/cm | 50 Ω/cm |

Simple and rapid nickel-plating of the articles placed in the enclosure 7 is therefore achieved. The thickness or ohmic value of the deposit can be controlled by varying treatment parameters such as the pressure in the plasma, such pressure varying typically between 0.2 and 50 mbar.

Any substrate which can withstand the cold post discharge plasma can therefore be metallised, adhesion of the deposit being enhanced with pretreatment by the post discharge nitrogen plasma, without an addition of metal carbonyl gas.

EXAMPLE 2

When an argon plasma is used after the pretreatment stage, a pink luminescence appears which is confined to zone A of the tube 3, the entire downstream part thereof being colourless.

Four zones (A, I, II and III) shown in FIG. 3 are observable in the plasma post-discharge zone when the gas compound Ni (CO)4 is injected as follows:

Zone A: Pink luminescence is present due to the argon plasma.

Zone I: This area is downstream of zone A and is colorless, wherein no deposition of nickel occurs.

Zone II: The downstream limit of zone I, a slight orange occurs. This zone is the optimum position for producing a substantial nickel deposit.

Zone III: This area is downstream of zone II and is colorless. Articles placed in zone III are covered by a thin nickel deposit.

An addition of Ni (CO)4 to the argon post discharge plasma confines the pink luminescence to zone A. Nickel deposition conditions correspond to an excess of argon plasma, as in the orange-colored zone II. The metal carbonyl gas molecules dissociate and the metal produced is deposited on the substrate as in the case of the nitrogen plasma.

Resistance measurements, similar to those listed in Table I for a nitrogen plasma, were made. Nickel deposition by an argon post-discharge plasma gave the results listed in Table II.

TABLE II

| POWER TRANSMITTED BY THE GENERATOR 1 (W) | 100 |
|---|---|
| DIAMETER OF THE TUBE 3 (mm) | 15 |
| VOLUME OF THE ENCLOSURE 7 (l) | 0.7 |
| NITROGEN PRESSURE (mbar) | 3 |
| TREATMENT TIME (mn) | 15 |
| ABS SUBSTRATE | 95 Ω/cm |
| POLYPROPYLENE SUBSTRATE | 1700 Ω/cm |

The process is therefore equally well suited to an argon plasma and to a nitrogen plasma. A mixture of nitrogen and rare gas in required proportions can also be used as plasmagenic gas. The post-discharge plasma used in the process according to the invention can be prepared from any non-oxidizing gas to avoid unwanted oxidation reactions of the metal carbonyl compound. It is interesting to note that the purity requirements for the plasmagenic gas used in the process according to the invention are not necessarily very stringent.

The nickel plating of workplaces or specimens has been described in the foregoing. Other metals can of course be plated in the same way.

The process according to the invention therefore applies preferably to transition metals—i.e., metals possessing in their fundamental state an unsaturated sublayer of electrons d (Nl, Fe, Cr, Mo, W, Co . . . ). The process also makes it possible to deposit metal alloys by injecting a gas embodied by a mixture of a number of metal carbonyl gases corresponding to different metal atoms. This possibility of depositing an alloy is not usually provided by previous processes in which layers must be deposited consecutively, such multilayer deposits being of course possible in the scope of this invention also.

The process according to the invention can be carried into effect with apparatuses other than those hereinbefore described with reference to FIG. 1. For example, the post-discharge plasma can be prepared from electric discharges of some other kind or in a frequency range other than 2450 MHz, such as 433 MHz, or 915 MHz and so on.

We claim:

1. A process for metallising a surface of a workpiece, comprising the steps of:
   producing a discharge plasma which is ionized and has charged species;

flowing said discharge plasma under a first pressure through a plasma tube into an enclosure which has a larger volume than that of the plasma tube, whereby said discharge plasma expands in said enclosure such that the charged species convert to neutral species, said enclosure at least partially defining a post-discharge zone containing substantially only the neutral species;

placing said workpiece having said surface to be metallised in said post-discharge zone;

flowing, separately from said discharge plasma, a metal carbonyl gas under a second pressure into said post-discharge zone, to react said carbonyl gas with the neutral species in the post-discharge zone, wherein metal from said metal carbonyl gas is deposited onto said surface.

2. The process of claim 1, wherein said first pressure is progressively decreased thereby metallising a plurality of workpieces distributed throughout said enclosure.

3. The process of claim 1, wherein said first pressure is between 0.2 mbar and 50 mbar.

4. The process of claim 1, wherein said second pressure is less than one-third of said first pressure.

5. The process of claim 1, wherein said metal carbonyl gas includes a plurality of different types metal atoms to produce an alloy deposit on said surface.

6. The process of claim 1, wherein said discharge plasma is nitrogen plasma.

7. The process of claim 1, wherein said discharge plasma is an argon plasma.

8. The process of claim 1, wherein said discharge plasma is a rare gas plasma.

9. The process of claim 1, wherein said discharge plasma is a mixture of nitrogen gas and rare gas.

10. The process of claim 1, wherein said metal carbonyl gas contains a transition metal.

11. A process for metallising a surface of a workpiece, comprising the steps of:

producing a nitrogen discharge plasma having nitrogen ions;

placing said workpiece having a surface to be metallised in a post-discharge zone in an enclosure;

pretreating said surface of said workpiece such that said surface has an increased wettability by flowing said nitrogen discharge plasma under a first pressure through a plasma tube into said post-discharge zone of said enclosure, said enclosure having a larger volume than that of the plasma tube whereby said nitrogen discharge plasma expands in said enclosure such that the nitrogen ions convert to neutral nitrogen atoms, said enclosure at least partially defining said post-discharge zone containing substantially only the neutral nitrogen atoms;

continuing said nitrogen discharge plasma, and simultaneously flowing, separately from said nitrogen discharge plasma, a metal carbonyl gas under a second pressure into said post-discharge zone after said surface of said workpiece is pretreated, wherein the metal carbonyl gas reacts with the neutral nitrogen atoms to deposit metal from said metal carbonyl gas onto said surface.

* * * * *